US008901576B2

(12) United States Patent
Doany et al.

(10) Patent No.: US 8,901,576 B2
(45) Date of Patent: Dec. 2, 2014

(54) SILICON PHOTONICS WAFER USING STANDARD SILICON-ON-INSULATOR PROCESSES THROUGH SUBSTRATE REMOVAL OR TRANSFER

(75) Inventors: Fuad E. Doany, Katonah, NY (US); Benjamin G. Lee, New York, NY (US); Alexander V. Rylyakov, Mount Kisco, NY (US); Clint L. Schow, Ossining, NY (US); Marc A. Taubenblatt, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 374 days.

(21) Appl. No.: 13/353,162

(22) Filed: Jan. 18, 2012

(65) Prior Publication Data

US 2013/0181233 A1   Jul. 18, 2013

(51) Int. Cl.
*H01L 33/00* (2010.01)
*H01L 29/18* (2006.01)
*H01L 21/00* (2006.01)

(52) U.S. Cl.
USPC .............. 257/88; 257/E33.073; 438/29

(58) Field of Classification Search
USPC ............................................. 257/88; 438/458
See application file for complete search history.

(56) References Cited

U.S. PATENT DOCUMENTS

| | | |
|---|---|---|
| 4,722,586 A | 2/1988 | Dodson et al. |
| 4,867,371 A | 9/1989 | Yamazaki |
| 4,935,939 A | 6/1990 | Liau et al. |
| 5,195,150 A | 3/1993 | Stegmueller et al. |
| 5,346,583 A | 9/1994 | Basavanhally |
| 5,499,312 A | 3/1996 | Hahn et al. |
| 5,568,574 A | 10/1996 | Tanguay, Jr. et al. |
| 5,790,730 A | 8/1998 | Kravitz et al. |
| 6,075,908 A | 6/2000 | Paniccia et al. |
| 6,095,697 A | 8/2000 | Lehman et al. |
| 6,304,687 B1 | 10/2001 | Inoue et al. |
| 6,333,208 B1 | 12/2001 | Li |
| 6,455,398 B1 | 9/2002 | Fonstad, Jr. et al. |
| 6,727,576 B2 | 4/2004 | Hedler et al. |
| 6,934,133 B2 | 8/2005 | Hayakawa et al. |
| 6,935,792 B2 | 8/2005 | Saia et al. |

(Continued)

OTHER PUBLICATIONS

U.S. Appl. No. 13/028,814, Doany et al.

(Continued)

*Primary Examiner* — Matthew Landau
*Assistant Examiner* — Igwe U Anya
(74) *Attorney, Agent, or Firm* — Yee & Associates; Anne Dougherty

(57) ABSTRACT

Processing for a silicon photonics wafer is provided. A silicon photonics wafer that includes an active silicon photonics layer, a thin buried oxide layer, and a silicon substrate is received. The thin buried oxide layer is located between the active silicon photonics layer and the silicon substrate. An electrical CMOS wafer that includes an active electrical layer is also received. The active silicon photonics layer of the silicon photonics wafer is flip chip bonded to the active electrical layer of the electrical CMOS wafer. The silicon substrate is removed exposing a backside surface of the thin buried oxide layer. A low-optical refractive index backing wafer is added to the exposed backside surface of the thin buried oxide layer. The low-optical refractive index backing wafer is a glass substrate or silicon substrate wafer. The silicon substrate wafer includes a thick oxide layer that is attached to the thin buried oxide layer.

23 Claims, 10 Drawing Sheets

(56) References Cited

U.S. PATENT DOCUMENTS

| | | | |
|---|---|---|---|
| 6,955,934 | B2 | 10/2005 | Gallup et al. |
| 7,010,184 | B2 | 3/2006 | Hasegawa et al. |
| 7,027,687 | B2 | 4/2006 | Kishima |
| 7,110,629 | B2 | 9/2006 | Bjorkman et al. |
| 7,128,476 | B1 | 10/2006 | Boudreaux et al. |
| 7,162,124 | B1 | 1/2007 | Gunn, III et al. |
| 7,203,387 | B2 | 4/2007 | Doan |
| 7,251,398 | B2 | 7/2007 | Baets et al. |
| 7,283,717 | B2 | 10/2007 | Mendoza et al. |
| 7,298,941 | B2 | 11/2007 | Palen et al. |
| 7,303,339 | B2 | 12/2007 | Zhou et al. |
| 7,344,383 | B1 | 3/2008 | Lu et al. |
| 7,349,614 | B2 | 3/2008 | Doan |
| 7,352,066 | B2 | 4/2008 | Budd et al. |
| 7,352,924 | B2 | 4/2008 | Gaebe et al. |
| 7,454,102 | B2 | 11/2008 | Keyser et al. |
| 7,454,105 | B2 | 11/2008 | Yi et al. |
| 7,548,669 | B2 | 6/2009 | Nakagawa |
| 7,553,088 | B2 | 6/2009 | Nakajima |
| 7,556,440 | B2 | 7/2009 | Birincioglu et al. |
| 7,639,912 | B2 | 12/2009 | Wang et al. |
| 7,702,197 | B2 | 4/2010 | Nakagawa |
| 7,703,993 | B1 | 4/2010 | Darbinyan et al. |
| 7,729,581 | B2 | 6/2010 | Rolston et al. |
| 7,773,836 | B2 | 8/2010 | De Dobbelaere |
| 7,801,397 | B2 | 9/2010 | Block et al. |
| 7,920,770 | B2 | 4/2011 | Holzwarth et al. |
| 2002/0076130 | A1 | 6/2002 | Pandraud |
| 2003/0231828 | A1 | 12/2003 | Brock et al. |
| 2004/0155325 | A1 | 8/2004 | Ma et al. |
| 2005/0058408 | A1 | 3/2005 | Colgan et al. |
| 2006/0177173 | A1 | 8/2006 | Shastri et al. |
| 2007/0274630 | A1 | 11/2007 | Ghrion et al. |
| 2008/0285920 | A1 | 11/2008 | Budd et al. |
| 2008/0298818 | A1 | 12/2008 | Epitaux et al. |
| 2009/0046456 | A1 | 2/2009 | Urano et al. |
| 2009/0087137 | A1* | 4/2009 | Doan ............................. 385/14 |
| 2009/0154872 | A1 | 6/2009 | Sherrer et al. |
| 2009/0226130 | A1 | 9/2009 | Doany et al. |
| 2009/0263923 | A1 | 10/2009 | Shimooka |
| 2009/0294814 | A1* | 12/2009 | Assefa et al. ................. 257/292 |
| 2010/0008675 | A1 | 1/2010 | De Dobbelaere |
| 2010/0055919 | A1* | 3/2010 | Carothers ..................... 438/710 |
| 2010/0059822 | A1* | 3/2010 | Pinguet et al. ................ 257/351 |
| 2010/0061683 | A1 | 3/2010 | Sasaki |
| 2010/0111473 | A1 | 5/2010 | Pinguet et al. |
| 2010/0119192 | A1 | 5/2010 | Fujikata et al. |
| 2010/0135619 | A1* | 6/2010 | Choi et al. ..................... 385/88 |
| 2011/0052114 | A1 | 3/2011 | Bernasconi et al. |
| 2011/0193169 | A1* | 8/2011 | Assefa et al. ................. 257/351 |
| 2011/0216997 | A1 | 9/2011 | Gothoskar et al. |
| 2012/0207426 | A1 | 8/2012 | Doany et al. |
| 2013/0084039 | A1 | 4/2013 | Doany et al. |

OTHER PUBLICATIONS

U.S. Appl. No. 13/211,018, Doany et al.

Doany et al., "Through-Substrate Optical Coupling to Photonic Chips," U.S. Appl. No. 13/370,886, filed Feb. 10, 2012, 28 pages.

Ade et al., "Direct backside connection of optical fibers to GaAs detectors", Proceedings of SPIE vol. 881, Optical Computing and Nonlinear Materials, May 1988, pp. 199-203.

Dillon et al., "Micromachining of a fiber-to-waveguide coupler using grayscale lithography and through-wafer etch", Proceedings of SPIE vol. 6882, Micromachining and Microfabrication Process Technology XIII, Feb. 2008, pp. 688206.1-688206.10.

Jones et al., "Advanced applications of wafer bonding," In: Silicon Wafer Bonding Technology for VLSI and MEMS Applications, Iyer et al., (Eds.), INSPEC/IEE, 2002, pp. 93-121.

Palen, "Optical coupling to monolithic integrated photonic circuits", Proceedings of SPIE vol. 6478, Photonics Packaging, Integration, and Interconnects VII, Feb. 2007, pp. 64780K.1-64708K.6.

Office Action, dated Dec. 20, 2012, regarding U.S. Appl. No. 13/028,814, 11 pages.

Final Office Action, dated Jul. 3, 2013, regarding U.S. Appl. No. 13/028,814, 11 pages.

Cunningham et al., "Compact, Thermally-Tuned Resonant Ring Muxes in CMOS with Integrated Backside Pyramidal Etch Pit," Optical Fiber Communication Conference, OSA Technical Digest (CD), Optical Society of America, Mar. 6, 2011, OMV3, 3 pages.

Holzwarth et al., "Localized Substrate Removal Technique Enabling Strong-Confinement Microphotonics in Bulk Si CMOS Processes," In: Conference on Lasers and Electro-Optics/Quantum Electronics and Laser Science Conference Photonic Applications Systems Technologies, OSA Technical Digest, CThKK5, Massachusetts Institute of Technology, May 2008, 2 pages.

Jones et al., "Advanced Applications of Wafer Bonding," In: Silicon Wafer Bonding Technology for VLSI and MEMS Applications, Iyer et al. (Eds.), INSPEC/IEE, United Kingdom, pp. 93-121, 2002 (Abstract only).

Lentine et al., High-speed optoelectronic VLSI switching chip with >4000 optical I/O based on flip-chip bonding of MQW modulators and detectors to silicon CMOS:, IEEE Journal of Selected Topics in Quantum Electronics, 2 (1):77-84, Apr. 1996.

Nakagawa et al., "Highly Efficient Coupling Between LD Array and Optical Fiber Array Using Si Microlens Array," IEEE Photonics Technology Letters, 5(9):1056-1058, Sep. 1993.

Orcutt, et al., "Photonic integration in a commercial scaled bulk-CMOS process," Massachusetts Institute of Technology, Nov. 3, 2009, 2 pages.

Schares et al., "Terabus: Terabit/Second-Class Card-Level Optical Interconnect Technologies," IEEE Journal of Selected Topics in Quantum Electronics, 12(5):1032-1044, Sep./Oct. 2006.

Tan et al., "Soldering Technology for Optoelectronic Packaging," In: Passive Micro-Optical Alignment Methods, Department of Mechanical Engineering, University of Colorado, pp. 149-186, Jun. 2005.

Thacker et al., "Flip-Chip Integrated Silicon Photonic Bridge Chips for Sub-Picojoule Per Bit Optical Links," 2010 Electronic Components and Technology Conference, Las Vegas, Nevada, pp. 240-246, Jun. 1-4, 2010.

Office Action, dated Mar. 19, 2014, regarding U.S. Appl. No. 13/028,814, 8 pages.

Office Action, dated Feb. 20, 2014, regarding U.S. Appl. No. 13/370,886, 17 pages.

* cited by examiner

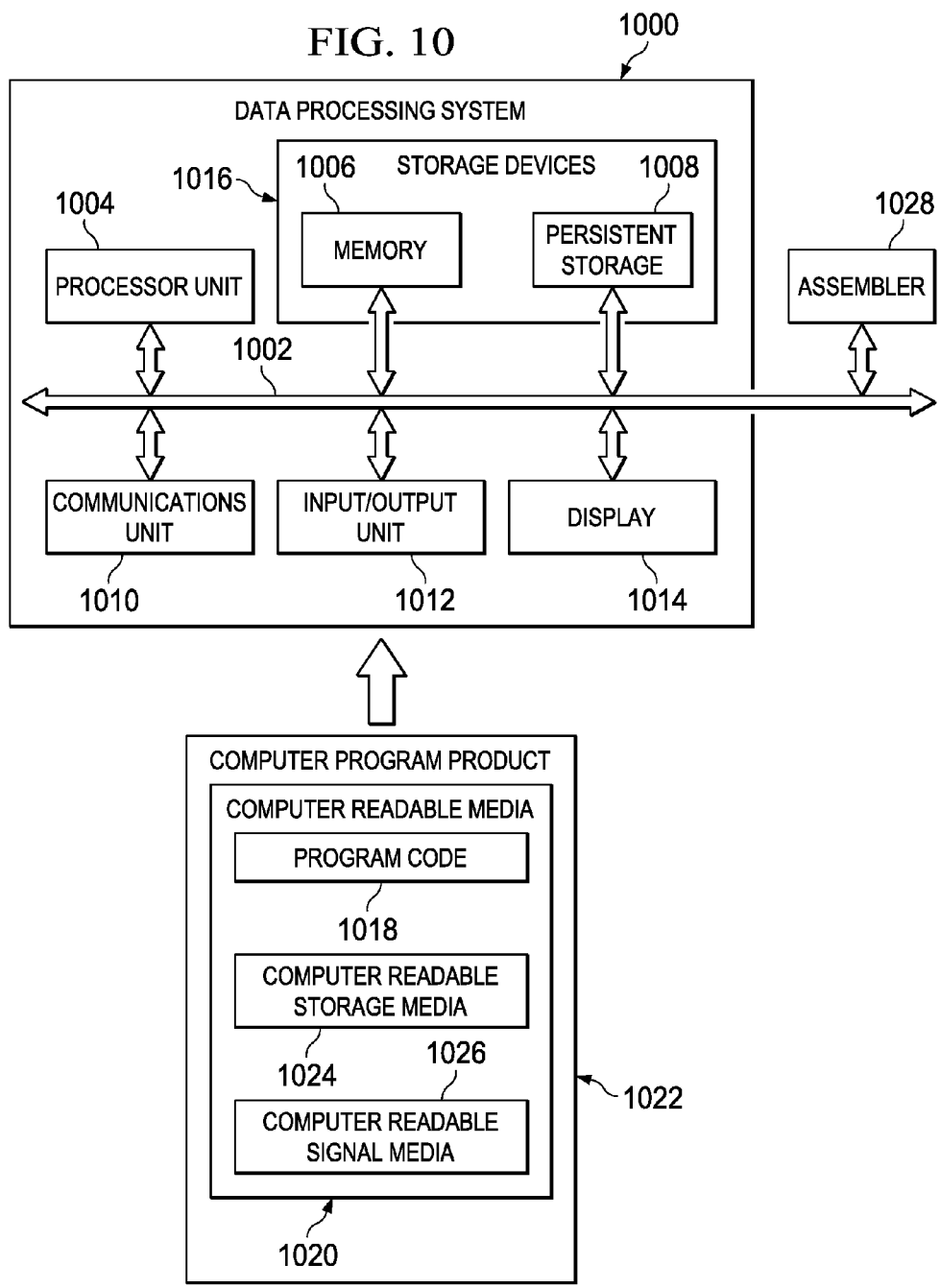

SILICON PHOTONICS WAFER USING STANDARD SILICON-ON-INSULATOR PROCESSES THROUGH SUBSTRATE REMOVAL OR TRANSFER

BACKGROUND

1. Field

The disclosure relates generally to an improved silicon photonics wafer and more specifically to fabricating a silicon photonics wafer using standard silicon-on-insulator processes through substrate removal or transfer.

2. Description of the Related Art

Silicon (Si) photonics is a technology that is under worldwide research and development due to its promise of delivering high performance optical components built in low-cost silicon chip technologies. Silicon photonics is the study and application of photonic systems that use silicon as an optical medium. The silicon is patterned with sub-micrometer precision into silicon photonic components. The silicon typically lies on top of a layer of silica in what is known as silicon-on-insulator (SOI).

In order for the silicon photonic components to remain optically independent from the bulk silicon of the wafer on which the silicon photonic components are fabricated, it is necessary to have a layer of intervening material. This layer of intervening material is usually silica, which has a lower optical refractive index than the silicon photonic components. As a result, light at the silicon-silica interface undergoes internal reflection and, therefore, remains in the silicon photonic components.

SUMMARY

According to one embodiment of the present invention, a method for processing a silicon photonics wafer is provided. A silicon photonics wafer that includes an active silicon photonics layer, a thin buried oxide layer, and a silicon substrate is received for processing. The thin buried oxide layer is located between the active silicon photonics layer and the silicon substrate. An electrical complementary metal-oxide-semiconductor wafer that includes an active electrical layer is also received. The active silicon photonics layer of the silicon photonics wafer is flip chip bonded to the active electrical layer of the electrical complementary metal-oxide-semiconductor wafer. The silicon substrate is removed from the silicon photonics wafer exposing a backside surface of the thin buried oxide layer. Also, a low-optical refractive index backing wafer is optionally added to the exposed backside surface of the thin buried oxide layer of the silicon photonics wafer. The low-optical refractive index backing wafer is either a glass substrate wafer or a silicon substrate wafer. In addition, the silicon substrate wafer includes a thick oxide layer that is attached to the thin buried oxide layer of the silicon photonics wafer.

BRIEF DESCRIPTION OF THE SEVERAL VIEWS OF THE DRAWINGS

FIG. 10 is a diagram of a data processing system in accordance with an illustrative embodiment.

DETAILED DESCRIPTION

With reference now to the figures, and in particular, with reference to FIGS. 1-6, diagrams of apparatuses are provided in which illustrative embodiments may be implemented. It should be appreciated that FIGS. 1-6 are only meant as examples and are not intended to assert or imply any limitation with regard to the apparatuses in which different embodiments may be implemented. Many modifications to the depicted apparatuses may be made.

Figure 1:
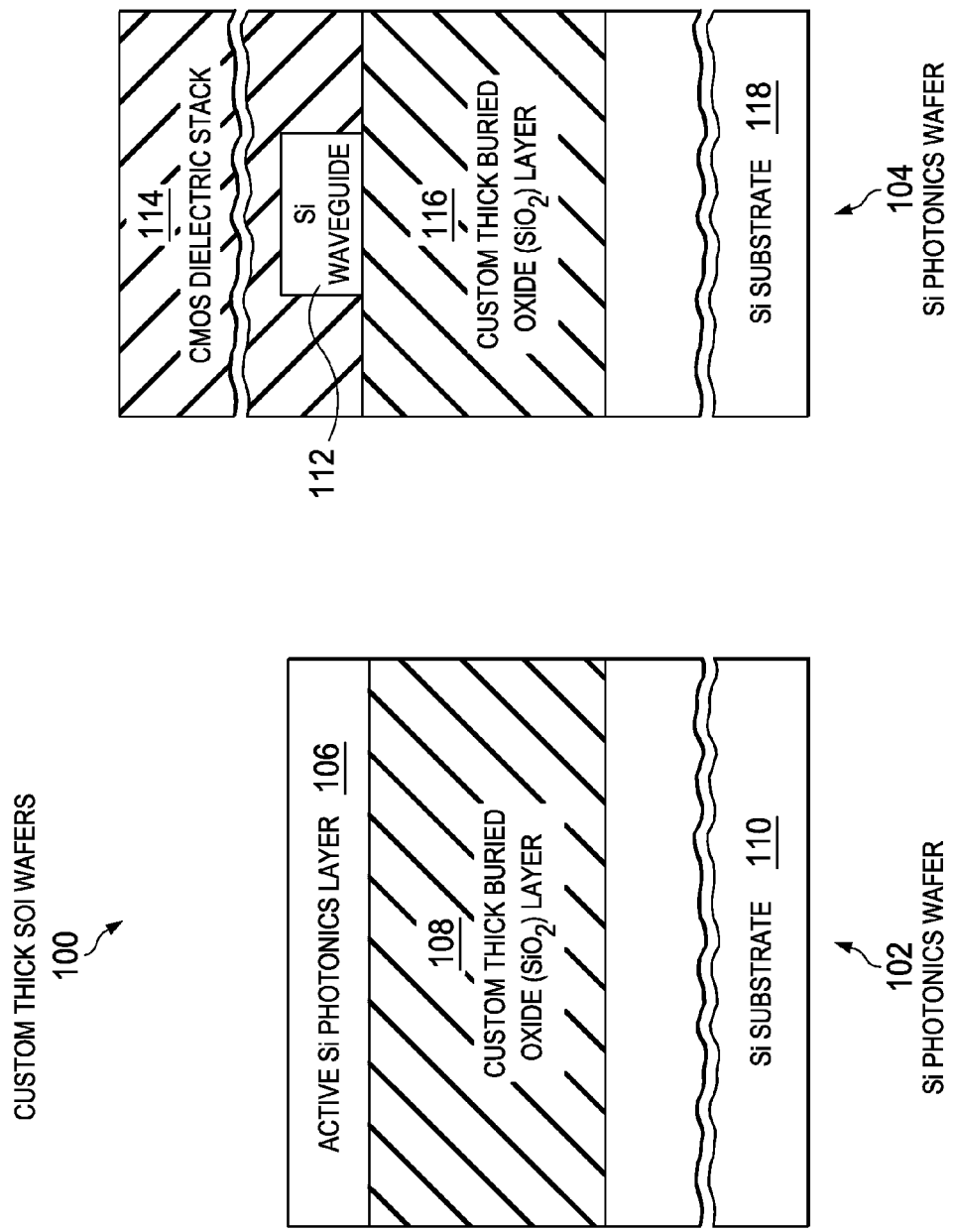
FIG. 1 is a diagram of a cross-section view of custom thick silicon-on-insulator wafers in accordance with an illustrative embodiment.

FIG. 1 depicts a diagram of a cross-section view of custom thick silicon-on-insulator wafers in accordance with an illustrative embodiment. Custom thick silicon-on-insulator (SOI) wafers 100 are non-standard silicon-on-insulator wafers. Custom thick silicon-on-insulator wafers 100 include silicon (Si) photonics wafer 102 and silicon photonics wafer 104. Silicon photonics wafer 102 includes active silicon photonics layer 106, custom thick buried oxide layer 108, and silicon substrate 110. Silicon photonics wafer 104 includes silicon waveguide 112, complimentary metal oxide-semiconductor (CMOS) dielectric stack 114, custom thick buried oxide layer 116, and silicon substrate 118.

In the course of developing illustrative embodiments, it was discovered that a custom, non-standard silicon-on-insulator wafer with a thick buried oxide layer was needed to enable functionality of silicon optical device structures in active silicon photonics layer 106 and silicon waveguide 112. The silicon optical device structures (i.e., photonic devices) are fabricated in the front side silicon layer of the silicon photonics wafer. A photonic device is any structure fabricated in the front side silicon layer that guides, generates, manipulates, or detects pulses of light. Examples of photonic devices are lasers, optical modulators, photodetectors, and optical switches, with optical waveguides used for optical input and output. In addition, the front side silicon layer also may include fabricated electronic devices, along with the photonic devices. Examples of electronic devices that may be included in the front side silicon layer are transistors, capacitors, resistors, and inductors. However, it should be noted that depending on the illustrative embodiment, the front side silicon layer may include only photonic devices or may include both electronic devices and photonic devices. A standard fabrication process for these photonic and electronic devices is a complimentary metal oxide-semiconductor (CMOS) process.

Custom thick buried oxide layer 108 of silicon photonics wafer 102 is buried between active silicon photonics layer 106 and silicon substrate 110. Active silicon photonics layer 106 is on a front side of silicon photonics wafer 102. Active silicon photonics layer 106 propagates light waves and includes the silicon photonic devices, which are essentially transparent to the light waves. In addition, as noted above, active silicon photonics layer 106 also may include electronic devices. Further, it should be noted that any active silicon photonics layer referenced in the detailed description below, in the figures, or in the claims may include both photonic devices and electronic devices or may include only photonic devices. Silicon substrate 110 is on a backside of silicon photonics wafer 102 and is a bulk silicon layer that provides support for silicon photonics wafer 102. Custom thick buried oxide layer 108 is typically greater than or equal to one (1) micrometer (um) in thickness. Custom thick buried oxide layer 108 may, for example, be comprised of silicon dioxide ($SiO_2$) material.

Without custom thick buried oxide layer 116, the high-optical refractive index of silicon substrate 118 makes it difficult to build low light transmission loss silicon waveguide structures, such as silicon waveguide 112. Light transmission loss is the reduction of the intensity of the light wave with respect to the distance traveled by the light wave through the transmission medium, which in this example is silicon waveguide 112. However, the requirement of a custom thick buried oxide layer adds to the complexity and cost of implementing silicon photonics wafers in a monolithically integrated CMOS process because standard industrial silicon-on-insulator processes use base wafers with a thin buried oxide layer. Typically, a standard thin buried oxide layer is less than 500 nanometers (nm) in thickness as compared to the one micrometer or greater thickness of a custom thick buried oxide layer.

Custom thick buried oxide layer 116 serves as a low-optical refractive index cladding material. In addition, CMOS dielectric stack 114 also serves as a low-optical refractive index cladding material. Cladding is one or more layers of lower optical refractive index material in contact with a core material of higher optical refractive index, which in this example is silicon waveguide 112 that is etched as a rectangular cross-section structure in the active silicon photonics layer. The cladding material causes light to be confined to the core of the silicon waveguide structure by internal reflection at the boundary between the cladding material and the silicon waveguide structure. However, if a standard thin buried oxide layer is used in fabricating the silicon photonics wafer, then high light transmission loss will occur because the light tends to couple with the higher optical refractive index of the silicon substrate of the silicon photonics wafer.

Illustrative embodiments enable low-loss silicon optical waveguide structures and other active silicon photonic devices in standard silicon-on-insulator processes using standard thin buried oxide layers by removing the higher optical refractive index silicon substrate from the silicon photonics wafer after fabrication of the silicon photonic devices and CMOS electrical devices in the active silicon photonics layer. By removing the backside higher optical refractive index silicon substrate below the buried oxide layer, illustrative embodiments make it possible to utilize standard silicon-on-insulator wafers, along with standard CMOS fabrication processes, while still enabling low-loss silicon optical waveguide structures to function in the front side active silicon photonics layer of the silicon photonics wafers. As a result, illustrative embodiments lower the complexity and cost of implementing silicon photonics wafers because illustrative embodiments allow for the use of unmodified CMOS silicon-on-insulator processing and wafers. Thus, by removing the requirement of a custom thick buried oxide layer, the additional steps to modify CMOS processes from standard silicon-on-insulator processes to accommodate thick silicon-on-insulator wafers is not required, which saves time and cost. Further, illustrative embodiments avoid issues with custom thick silicon-on-insulator wafers, such as, for example, increased wafer bowing as compared to the thin silicon-on-insulator wafers and the lack of thick silicon-on-insulator substrates in any diameters larger than 200 millimeters (mm).

Figure 2:
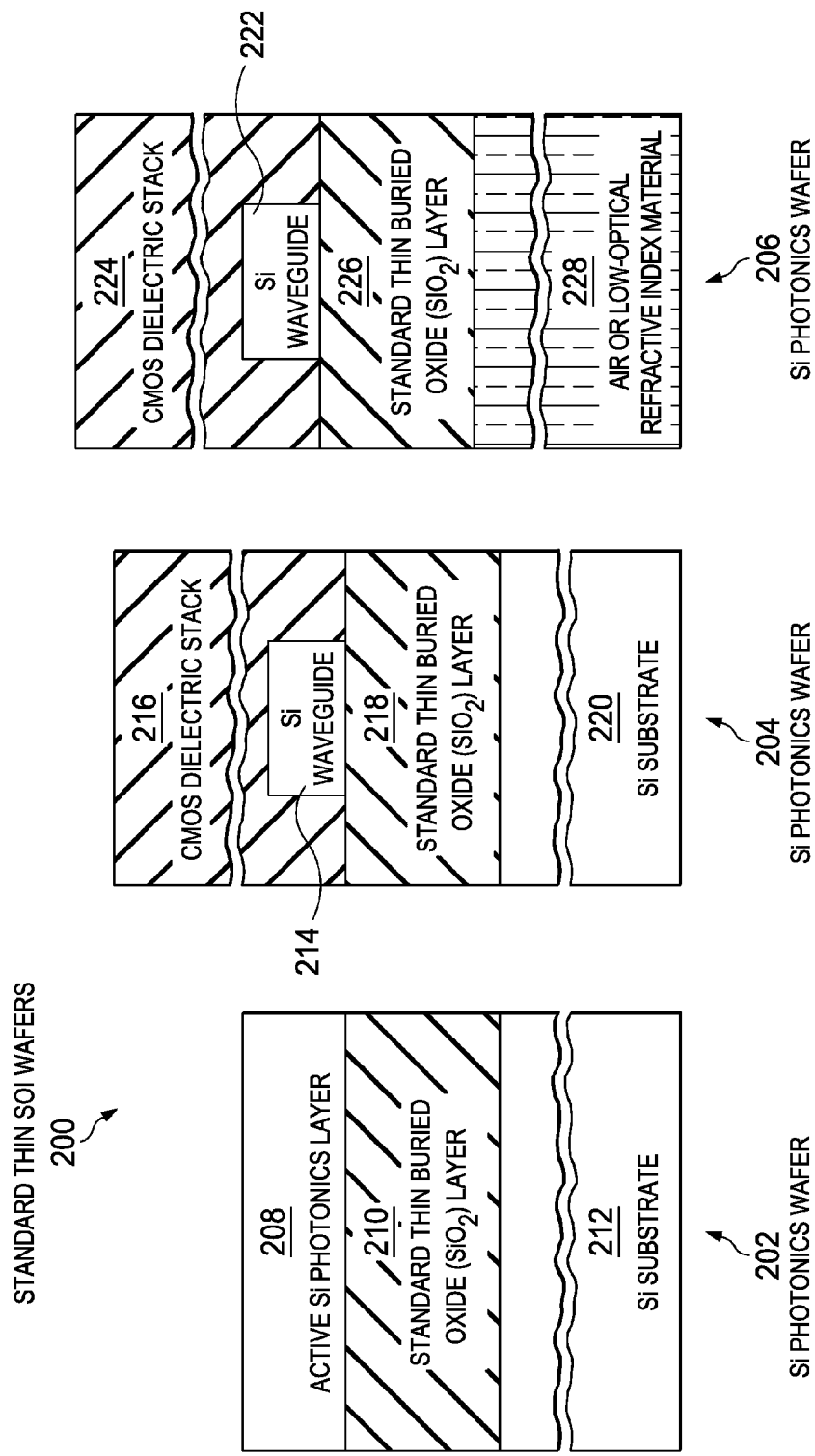
FIG. 2 is a diagram of a cross-section view of standard thin silicon-on-insulator wafers in accordance with an illustrative embodiment.

With reference now to FIG. 2, a diagram of a cross-section view of standard thin silicon-on-insulator wafers is depicted in accordance with an illustrative embodiment. Standard thin silicon-on-insulator wafers 200 include silicon photonics wafer 202, silicon photonics wafer 204, and silicon photonics wafer 206. Silicon photonics wafer 202 includes active silicon photonics layer 208 and silicon substrate 212, such as active silicon photonics layer 106 and silicon substrate 110 of silicon photonics wafer 102 in FIG. 1. In addition, silicon photonics wafer 202 includes standard thin buried oxide layer 210. Standard thin buried oxide layer 210 is less than or equal to 500 nanometers (nm) in thickness.

Silicon photonics wafer 204 includes silicon waveguide 214, CMOS dielectric stack 216, and silicon substrate 220, such as silicon waveguide 112, CMOS dielectric stack 114, and silicon substrate 118 of silicon photonics wafer 104 in FIG. 1. In addition, silicon photonics wafer 204 includes standard thin buried oxide layer 218, such as standard thin buried oxide layer 210 of silicon photonics wafer 202. However, silicon photonics wafers 202 and 204 do not enable functionality of silicon optical waveguide structures due to the close proximity of the high-optical refractive index silicon substrates 212 and 220 to the silicon photonic devices, such as silicon waveguide 214, in the active silicon photonics layer. It should be noted that silicon photonics wafer 204 may or may not include electronic devices in the active silicon photonics layer of the wafer, along with the photonic devices.

By removing the high-optical refractive index silicon substrates 212 and 220 after the active device structures are fabricated in the active silicon photonics layer, illustrative embodiments enable the functionality of silicon photonic structures fabricated on standard thin oxide silicon-on-insulator wafers, which offer low-loss light propagation because the silicon core region (i.e., silicon waveguide 222) is now surrounded by low-optical refractive index material (i.e., CMOS dielectric stack 224 on a front side of silicon waveguide 222 and standard thin buried oxide layer 226 on a backside of silicon waveguide 222). In addition, illustrative embodiments may subsequently add either air or low-optical refractive index material 228 on a backside surface of standard thin buried oxide layer 226.

Figure 3:
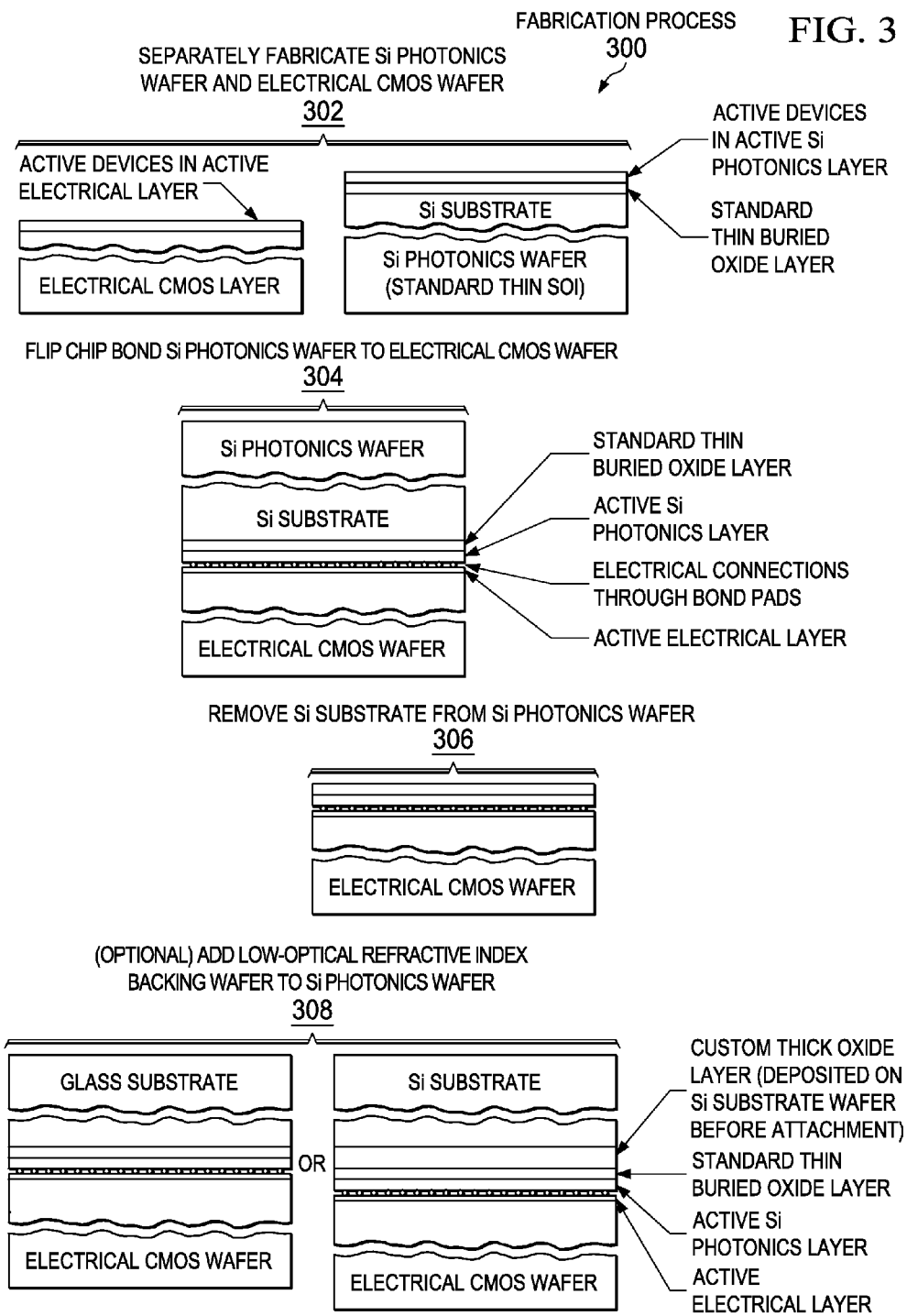
FIG. 3 is a pictorial illustration of a fabrication process for a silicon photonics wafer in accordance with an illustrative embodiment.

With reference now to FIG. 3, a pictorial illustration of a fabrication process for a silicon photonics wafer is depicted in accordance with an illustrative embodiment. FIG. 3 illustrates an example of a fabrication process for manufacturing a silicon photonics wafer, such as silicon photonics wafer 206 in FIG. 2. FIG. 3 is only meant as an example of a fabrication process for a silicon photonics wafer and is not intended as a limitation for illustrative embodiments. In other words, more or fewer process steps may be included in fabrication process 300, or process steps may be combined.

Fabrication process 300 is a process for electrically bonding a standard thin silicon-on-insulator photonics wafer to an electrical CMOS wafer. Fabrication process 300 includes process steps 302, 304, 306, and 308. Process step 302 includes fabrication of a silicon photonics wafer with a standard thin buried oxide layer, such as silicon photonics wafer 202 in FIG. 2. Further, process step 302 includes fabrication of an electrical CMOS wafer.

At step 302, a silicon photonics wafer is designed in a standard silicon-on-insulator CMOS process and then fabricated. The fabrication of the silicon photonics wafer includes the formation of electrical CMOS devices and optical devices in the active silicon photonics layer, such as active silicon photonics layer 208 in FIG. 2. The electrical CMOS devices may be, for example, transistors, capacitors, resistors, and inductors. The optical or photonic devices may be, for example, waveguides, splitters, combiners, wavelength-division multiplexing (WDM) structures, modulators, and photodiodes. The wavelength-division multiplexing structures may include wavelength multiplexors and wavelength demultiplexors. Depending on the illustrative embodiment, the silicon photonics wafer may either contain only photonic devices or both electronic and photonic devices. The silicon photonics wafer is an example of a semiconductor chip that may be used in a data processing system. The silicon photonics wafer is capable of transmitting and receiving pulses of light, which are used to communicate data. In other words, the silicon photonics wafer is an optical transceiver device.

Once standard CMOS fabrication of the silicon photonics wafer is completed, additional processing options of the silicon photonics wafer are available for silicon substrate removal and/or transfer of a new low-optical refractive index substrate material onto the silicon photonics wafer. Although the additional processing options are described herein as wafer-scale processes, it should be noted that each processing option may be performed on individual chips. For processing options where the silicon photonics wafer is transferred or bonded to a new substrate, the new substrate may include optical and mechanical features. The optical features included in the new substrate may be, for example, integrated micro-lenses or prisms and the mechanical features may be, for example, alignment holes or posts.

Figure 6:
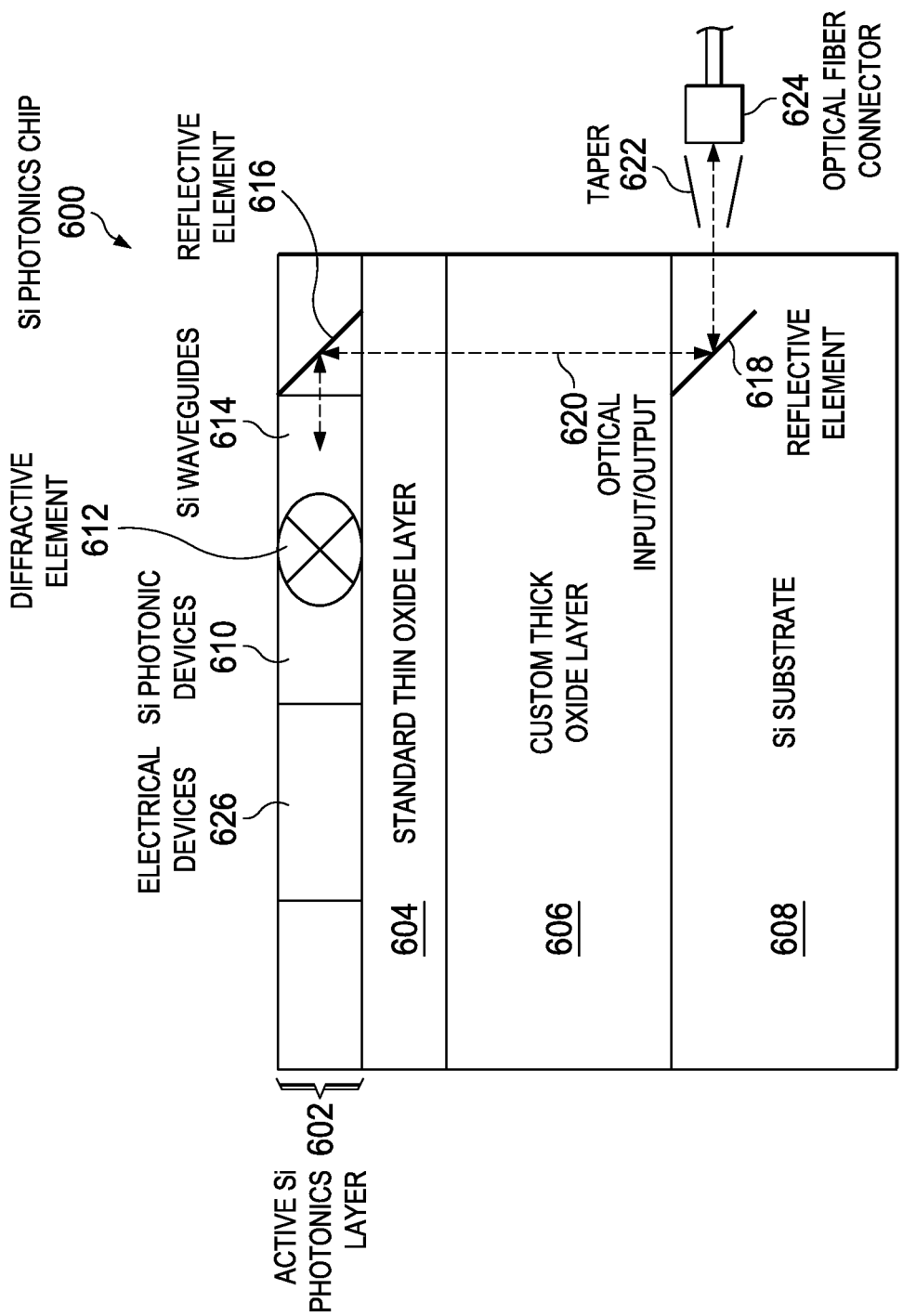
FIG. 6 is a diagram of a cross-section view of a silicon photonics chip in accordance with an illustrative embodiment.

In addition to the optical lens structures and mechanical alignment features designed for surface-normal optical coupling, the new substrate bonded to the silicon photonics wafer also may include features designed to turn optical signals by 90-degrees such that the optical signals enter/exit the new substrate of the silicon photonics chip in a direction parallel to the silicon photonics chip, which is shown in the example of FIG. 6. These optical signal turning structures may be, for example, 45-degree mirrors or diffractive grating structures. Further, silicon photonic waveguide structures may be fabricated either directly in the new substrate or added to a front surface or a rear surface of the new substrate prior to attachment of the new substrate to the silicon photonics chip. These silicon photonic waveguide structures may be coupled to the optical signal turning structures under the photonic devices to couple light from the waveguide structures in the new substrate to the silicon photonics chip. Moreover, these silicon photonic waveguide structures may be combined with coupling structures, such as tapers, at an edge of the silicon photonics chip for coupling an optical fiber to the waveguide structures in the new substrate.

At process step 304, the silicon photonics wafer is bonded to the electrical CMOS wafer. The electrical CMOS wafer may include a variety of circuits, such as, for example, digital logic, high-speed analog, and microprocessors, in the active electrical layer. The silicon photonics wafer is flip chip bonded with its active silicon photonics layer, such as active silicon photonics layer 208 in FIG. 2, facing the active electrical layer of the electrical CMOS wafer where electrical connections are established between the silicon photonics wafer and the electrical CMOS wafer through conductive bump technology. Conductive bumps may be, for example, solder bumps, gold balls, molded studs, or electrically conductive plastics. This type of mounting also is known as the Controlled Collapse Chip Connection, or C4. In addition, this type of mounting leaves a small space between the silicon photonics wafer and the electrical CMOS wafer. An electrically-insulating adhesive may be used to "under fill" this small space between the wafers to provide a stronger mechanical connection, to provide a heat bridge, and to ensure that the conductive bumps are not stressed due to differential heating of the two wafers.

After the wafers are bonded together and the electrical connections made, the silicon substrate of the silicon photonics wafer, such as silicon substrate 212 in FIG. 2, is removed at process step 306. Removing the silicon substrate exposes a backside surface of the thin buried oxide layer, such as standard thin buried oxide layer 226 in FIG. 2. Illustrative embodiments utilize the thin buried oxide layer as a built-in etch stop for complete removal of the silicon substrate. This removal of the silicon substrate may be accomplished by mechanical grinding or polishing, chemical etching, or both.

After the removal of the silicon substrate, a low-optical refractive index material, such as low-optical refractive index material 228 in FIG. 2, may be added to the exposed backside of the thin buried oxide layer of the silicon photonics wafer at process step 308. However, it should be noted that process step 308 is an optional process step and is not required to be performed during fabrication process 300. The low-optical refractive index material added to the exposed backside surface of the thin buried oxide layer of the silicon photonics wafer may be, for example, a glass substrate backing wafer or a silicon substrate backing wafer. The silicon substrate backing wafer includes a thick oxide layer, which is attached to the exposed backside of the thin buried oxide layer of the silicon photonics wafer. Attaching the thick oxide layer of the silicon substrate backing wafer to the thin buried oxide layer forms a custom thick buried oxide layer, such as custom thick buried oxide layer 108 in FIG. 1. Also, the added low-optical refractive index material may be used for additional mechanical strength for the silicon photonics wafer.

Moreover, it should be noted that although an electrical CMOS wafer is shown in this example of FIG. 3, the electrical wafer may be fabricated in silicon CMOS, silicon-germanium (SiGe) bipolar, or any other semiconductor integrated circuit process. Furthermore, although complete silicon substrate removal is shown at process step 306, silicon substrate removal may be performed only at selected sites under photonic devices located within the active silicon photonics layer of the silicon photonics wafer exposing a backside surface of the thin buried oxide layer at the selected sites, which is discussed in the detailed description of FIG. 5 below.

Figure 4:
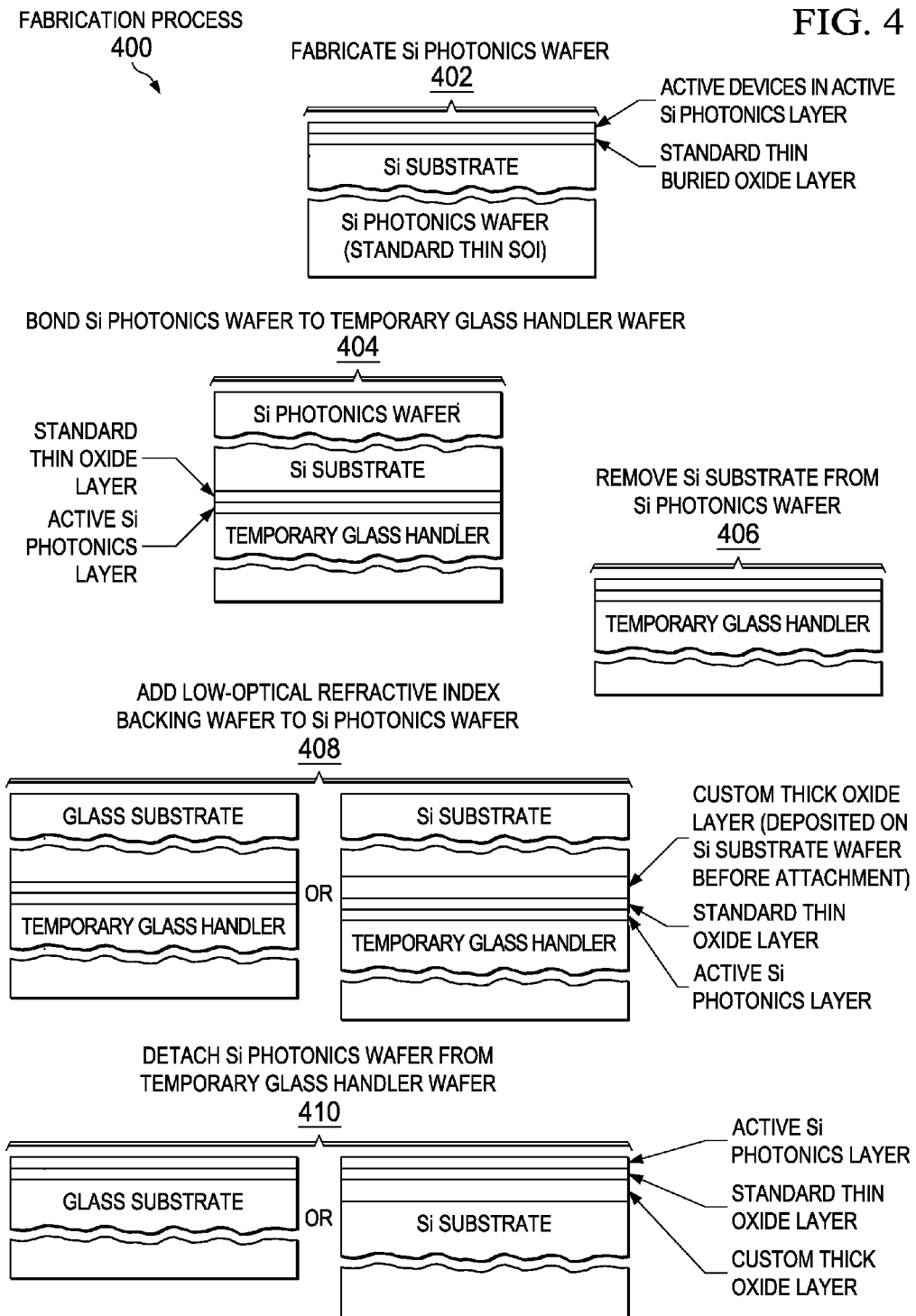
FIG. 4 is another pictorial illustration of a fabrication process for a silicon photonics wafer in accordance with an illustrative embodiment.

With reference now to FIG. 4, another pictorial illustration of a fabrication process for a silicon photonics wafer is depicted in accordance with an illustrative embodiment. FIG. 4 also illustrates an example of a fabrication process for manufacturing a silicon photonics wafer, such as silicon photonics wafer 206 in FIG. 2. FIG. 4 is only meant as an example of a fabrication process for a silicon photonics wafer and is not intended as a limitation for illustrative embodiments. In other words, more or fewer process steps may be included in fabrication process 400, or process steps may be combined.

Fabrication process 400 is a process for transferring a silicon photonics wafer to a low-optical refractive index material, such as low-optical refractive index material 228 in FIG. 2. Fabrication process 400 includes process steps 402, 404, 406, 408, and 410. Process step 402 includes fabrication of a silicon photonics wafer with a standard thin buried oxide layer, such as standard thin buried oxide layer 226 in FIG. 2.

At process step 404, the silicon photonics wafer is bonded to a temporary handler wafer. An adhesive, for example, may be used to bond the silicon photonics wafer to the temporary handler wafer. Also, the temporary handler wafer may be, for example, a glass handler wafer. The active devices in the active silicon photonics layer of the silicon photonics wafer are face down toward the temporary handler wafer.

At process step 406, the silicon substrate is removed from the silicon photonics wafer similar to process step 306 in FIG. 3 above. Removing the silicon substrate exposes a backside surface of the thin buried oxide layer. After removal of the silicon substrate, a backing wafer with a low-optical refractive index is bonded to the exposed backside of the thin buried oxide layer of the silicon photonics wafer at process step 408. This low-optical refractive index backing wafer may be, for example, made of glass or other material. The other material may be, for example, a silicon substrate wafer that includes a thick oxide layer, which is bonded to the exposed backside of the thin buried oxide layer.

After the low-optical refractive index backing wafer is bonded to the silicon photonics wafer, the front side surface of the active silicon photonics layer of the silicon photonics wafer is detached from the temporary handler wafer at step 410. The low-optical refractive index backing wafer is now the new substrate for the silicon photonics wafer. After completing fabrication process 400, the silicon photonics wafer with the new substrate may be, for example, electrically attached to an electrical CMOS wafer through conventional processes, such as solder bumping and reflow, similar to process step 304 in FIG. 3 above. Also, it should be noted that although complete substrate removal is shown in process step 406, silicon substrate removal may be performed only at selected sites under photonic devices located within the active silicon photonics layer of the silicon photonics wafer exposing a backside surface of the thin buried oxide layer at the selected sites, which is discussed in the detailed description of FIG. 5 below.

Figure 5:
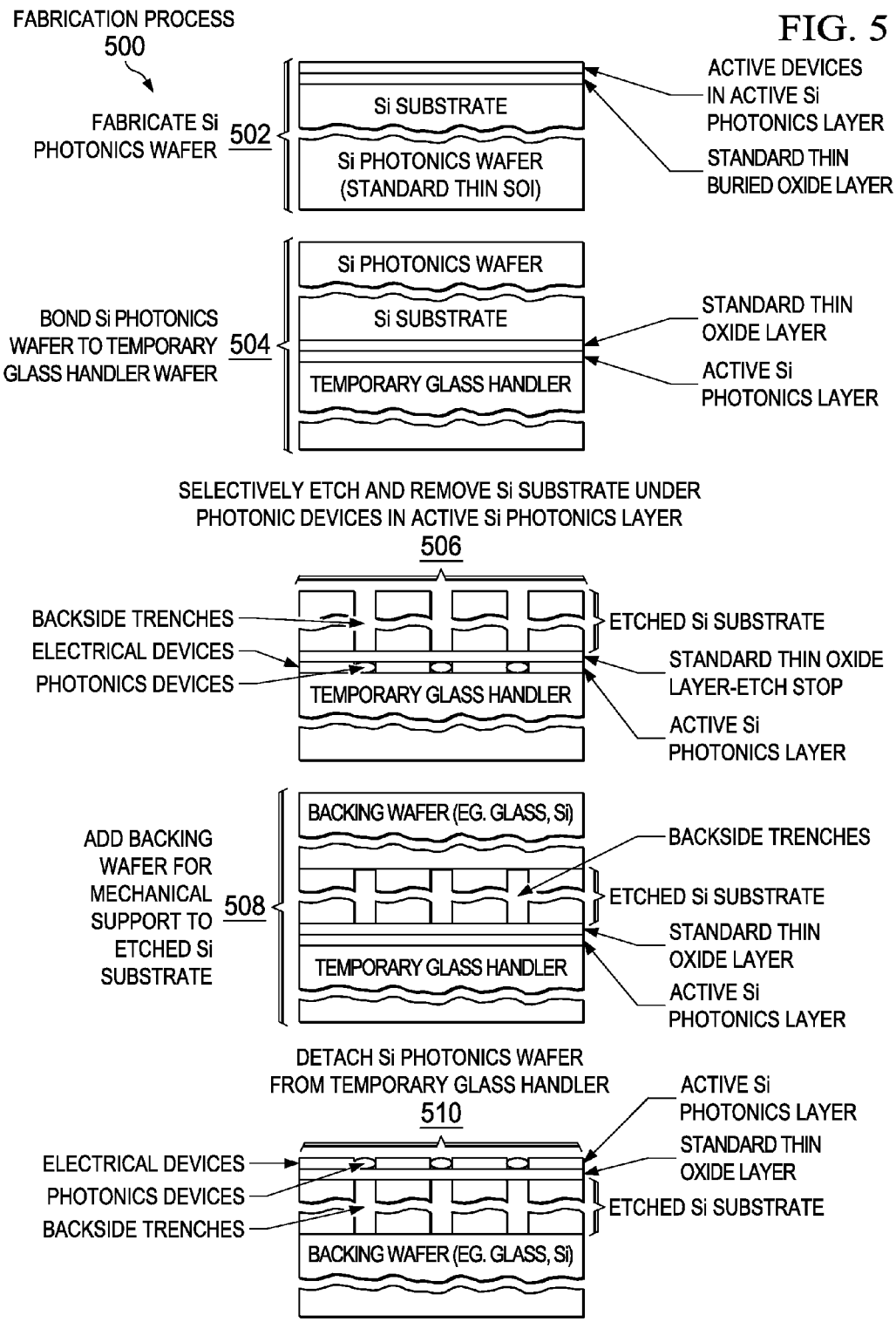
FIG. 5 is yet another pictorial illustration of a fabrication process for a silicon photonics wafer in accordance with an illustrative embodiment.

With reference now to FIG. 5, yet another pictorial illustration of a fabrication process for a silicon photonics wafer is depicted in accordance with an illustrative embodiment. FIG. 5 also illustrates an example of a fabrication process for manufacturing a silicon photonics wafer, such as silicon photonics wafer 206 in FIG. 2. FIG. 5 is only meant as an example of a fabrication process for a silicon photonics wafer and is not intended as a limitation for illustrative embodiments. In other words, more or fewer process steps may be included in fabrication process 500, or process steps may be combined.

Fabrication process 500 is a process for the removal of the silicon substrate at selected sites under photonic devices in an active silicon photonics layer of a silicon photonics wafer and attachment of a backing wafer to the silicon substrate. Fabrication process 500 includes process steps 502, 504, 506, 508, and 510. Process step 502 includes fabrication of a silicon photonics wafer with a standard thin buried oxide layer, such as standard thin buried oxide layer 226 in FIG. 2.

At process step 504, the silicon photonics wafer is bonded to a temporary handler wafer with an adhesive, for example. The temporary handler wafer may be, for example, a glass handler wafer. The active devices in the active silicon photonics layer of the silicon photonics wafer are face down toward the temporary handler wafer.

At process step 506, backside trenches are etched in the silicon substrate at selected sites under photonic devices, such as optical waveguides, located within the active silicon photonics layer of the silicon photonics wafer. In the example at step 506, three photonic devices are located under the three backside trenches. However, it should be noted that the three illustrated photonic devices represent a 3×N array of photonic devices in the active silicon photonics layer. In addition, illustrative embodiments are not limited to a 3×N array of photonic devices or to three backside trenches. In other words, illustrative embodiments may utilize any number of photonic devices and backside trenches in the silicon photonics wafer.

The selective silicon substrate removal is performed using a photolithography process on the backside of the silicon photonics wafer followed by chemical etching. Selectively etching backside trenches in the silicon substrate exposes a backside surface of the thin buried oxide layer at the selected sites. The backside trenches may be, for example, filled with air. Also, it should be noted that the silicon substrate may be left intact under electronic devices located within the active silicon photonics layer where the silicon substrate was not removed by the chemical etching. In this example, four electrical devices are located under the four columns of silicon substrate that represent a 4×N array of electrical devices in the active silicon photonics layer. However, it should be noted that illustrative embodiments are not limited to a 4×N array of electrical devices and may utilize any number of electrical devices in the silicon photonics wafer.

After the silicon substrate is removed at the selected sites, a low-optical refractive index backing wafer is added to a backside surface of the etched silicon substrate of the silicon photonics wafer at process step 508 covering the backside trenches. In addition, the backing wafer may add mechanical strength to prevent the silicon photonics wafer from breaking in areas where the silicon substrate has been completely removed. The low-optical refractive index backing wafer added to the etched silicon substrate of the silicon photonics wafer may be, for example, a glass substrate backing wafer or a silicon substrate backing wafer. After the low-optical refractive index backing wafer is bonded to the silicon photonics wafer, the front side surface of the active silicon photonics layer of the silicon photonics wafer is detached from the temporary glass handler wafer at step 510. After completing fabrication process 500, the silicon photonics wafer with the added backing wafer may be, for example, electrically attached to an electrical CMOS wafer through conventional processes, such as solder bumping and reflow, similar to process step 304 in FIG. 3 above.

With reference now to FIG. 6, a diagram of a cross-section view of a silicon photonics chip is depicted in accordance with an illustrative embodiment. Silicon photonics chip 600 includes active silicon photonics layer 602, standard thin oxide layer 604, custom thick oxide layer 606, and silicon substrate 608. Silicon photonics chip 600 is similar to the silicon photonics wafer with the silicon substrate backing wafer at process step 410 in FIG. 4. In this example of FIG. 6, in addition to including electrical devices 626, active silicon photonics layer 602 also includes silicon photonic devices 610, diffractive element 612, silicon waveguides 614, and reflective element 616.

Silicon photonic devices 610 represents a plurality of silicon photonic devices that are integrally fabricated by a microlithographic process into the silicon of active silicon photonics layer 602, along with silicon waveguides 614, diffractive element 612, and reflective element 616. In the case of diffractive element 612, the addition of a mirror or thin metal film layer above diffractive element 612 may be used to enhance optical coupling efficiency between diffractive element 612 and silicon photonic devices 610. The mirror or thin metal film layer may be, for example, located in a CMOS dielectric stack, such as CMOS dielectric stack 224 in FIG. 2.

Silicon photonic devices 610 may represent an N×N array of different types of photonic devices. For example, silicon photonic devices 610 may represent emitters or modulators for transmitting optical data signals and also may represent photodiodes for receiving optical data signals. Thus, silicon photonic devices 610 may provide optical transceiver capabilities for silicon photonics chip 600.

Silicon waveguides 614 may be, for example, rectangular structures that guide optical signals or electromagnetic waves to and from silicon photonic devices 610. Silicon waveguides 614 represent arrays of silicon waveguides for guiding optical input/output 620 to and from the array of silicon photonic devices 610. Reflective element 616 is another microlithographically etched structure in active silicon photonics layer 602 designed to reflect optical input/output 620 to and from silicon photonic devices 610 via silicon waveguides 614. Alternatively, reflective element 616 may be, for example, a mirror or a thin metal film.

Similarly, diffractive element 612 also is a microlithographically fabricated structure in active silicon photonics layer 602 that is designed to diffract rather than reflect optical input/output 620 to and from silicon photonic devices 610. One benefit of using diffractive element 612 is that diffractive element 612 may perform a plurality of optical operations simultaneously. However, it should be noted that even though in this example of FIG. 6 a combination of reflective and diffractive elements are fabricated in silicon photonics chip 600, alternative illustrative embodiments may use only reflective elements or may use only diffractive elements in silicon photonics chip 600.

Silicon photonics chip 600 also includes reflective element 618. In this example of FIG. 6, reflective element 618 is microlithographically fabricated in silicon substrate 608. Reflective element 618 is designed to turn optical input/output 620 by 90-degrees such that the optical signals entering or exiting silicon substrate 608 in a direction parallel to silicon photonics chip 600 may be used by silicon photonic devices 610 within active silicon photonics layer 602. Reflective element 618 may be, for example, a turning structure, such as a 45-degree mirror. Alternatively, a diffractive grating structure may be used instead of reflective element 618. Further, silicon waveguide structures may be microlithographically fabricated in silicon substrate 608 to transport optical input/output 620 through silicon substrate 608. These silicon photonic waveguide structures may be optically coupled to reflective element 616 for propagation of optical input/output 620 to silicon waveguides 614. Moreover, these silicon photonic waveguide structures in silicon substrate 608 may be combined with coupling structures, such as taper 622, at an edge of silicon photonics chip 600 for coupling to an optical fiber connector, such as optical fiber connector 624.

Figure 7:
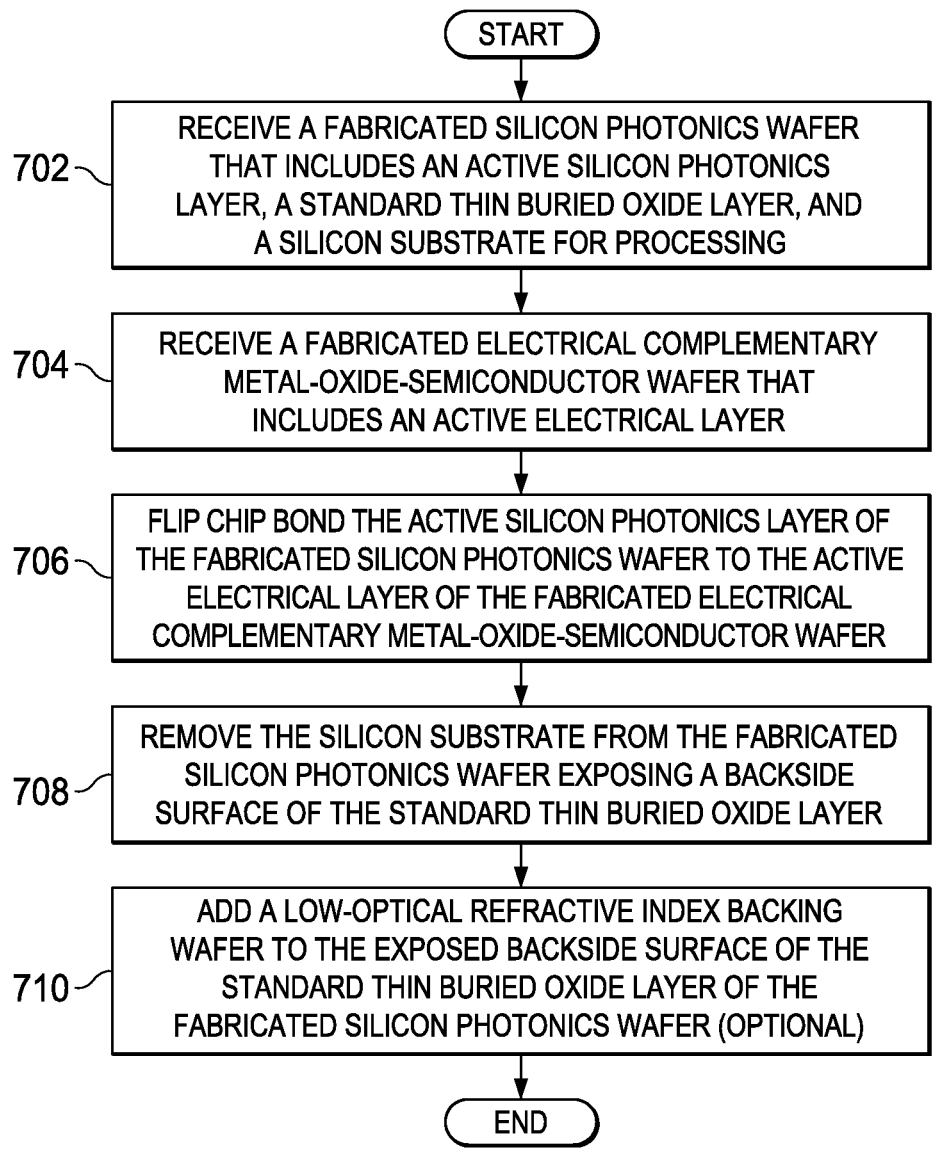
FIG. 7 is a flowchart illustrating a process for fabricating a silicon photonics wafer in accordance with an illustrative embodiment.

With reference now to FIG. 7, a flowchart illustrating a process for fabricating a silicon photonics wafer is shown in accordance with an illustrative embodiment. The process shown in FIG. 7 may be implemented in a fabrication process, such as fabrication process 300 in FIG. 3. In addition, a data processing system with a communicatively coupled assembler, such as data processing system 1000 in FIG. 10, may perform the process shown in FIG. 7. The assembler may be, for example, a system of hardware and software components that fabricates, assembles, or processes silicon photonics wafers.

The process begins when the assembler receives a fabricated silicon photonics wafer that includes an active silicon photonics layer, a standard thin buried oxide layer, and a silicon substrate for processing (step 702). The fabricated silicon photonics wafer may be, for example, silicon photonics wafer 202 in FIG. 2. Concurrent with receiving the fabricated silicon photonics wafer or after receiving the fabricated silicon photonics wafer at step 702, the assembler also receives a fabricated electrical CMOS wafer that includes an active electrical layer (step 704).

Then the assembler flip chip bonds the active silicon photonics layer of the fabricated silicon photonics wafer to the active electrical layer of the fabricated electrical CMOS wafer similar to process step 304 in FIG. 3 (step 706). Subsequent to flip chip bonding the active silicon photonics layer of the fabricated silicon photonics wafer to the active electrical layer of the fabricated electrical CMOS wafer in step 706, the assembler removes the silicon substrate from the fabricated silicon photonics wafer exposing a backside surface of the standard thin buried oxide layer similar to process step 306 in FIG. 3 (step 708). After removing the silicon substrate from the fabricated silicon photonics wafer exposing the backside surface of the standard thin buried oxide layer in step 708, the assembler may optionally add a low-optical refractive index backing wafer to the exposed backside surface of the standard thin buried oxide layer of the fabricated silicon photonics wafer similar to process step 308 in FIG. 3 (step 710). The low-optical refractive index backing wafer may be, for example, a glass substrate backing wafer or a silicon substrate backing wafer. The silicon substrate backing wafer includes a thick oxide layer, which is attached to the exposed backside of the thin buried oxide layer of the silicon photonics wafer. The process terminates thereafter.

Figure 8:
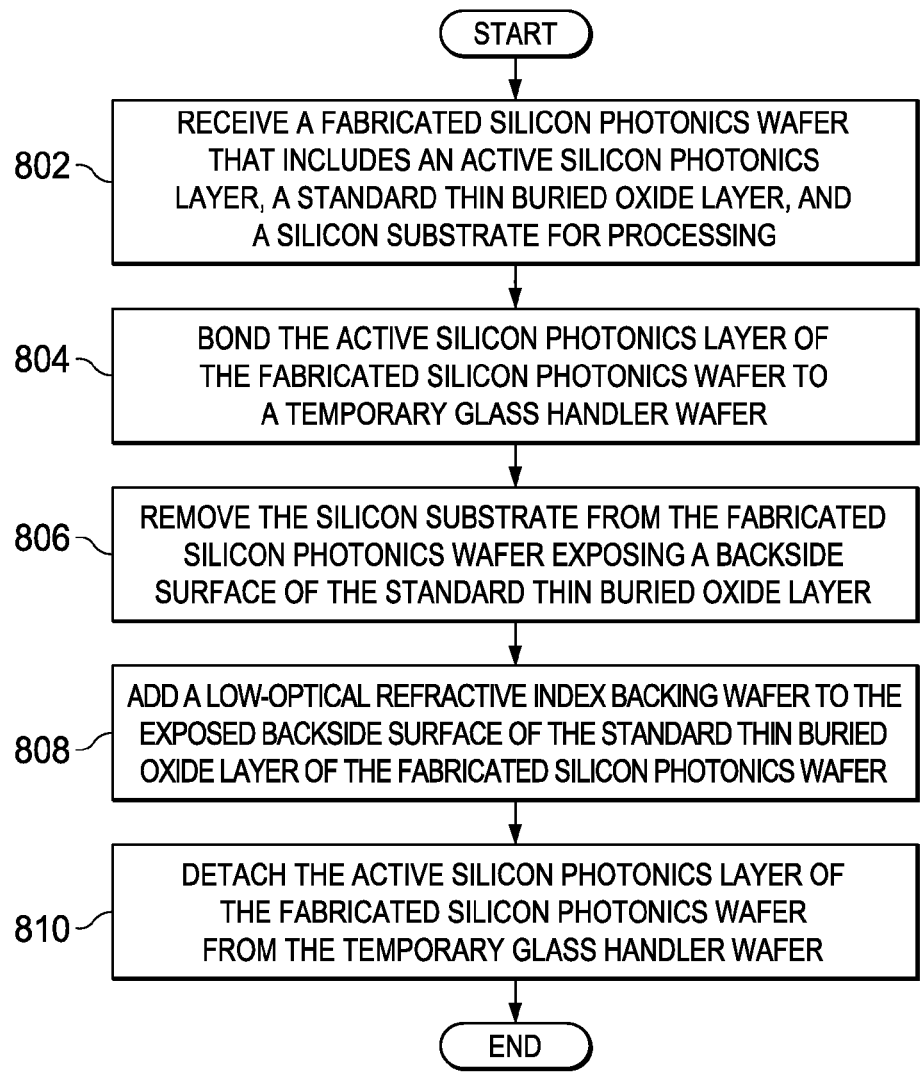
FIG. 8 is a flowchart illustrating another process for fabricating a silicon photonics wafer in accordance with an illustrative embodiment.

With reference now to FIG. 8, a flowchart illustrating another process for fabricating a silicon photonics wafer is shown in accordance with an illustrative embodiment. The process shown in FIG. 8 may be implemented in a fabrication process, such as fabrication process 400 in FIG. 4. In addition, a data processing system with a communicatively coupled assembler, such as data processing system 1000 in FIG. 10, may perform the process shown in FIG. 8.

The process begins when the assembler receives a fabricated silicon photonics wafer that includes an active silicon photonics layer, a standard thin buried oxide layer, and a silicon substrate for processing (step 802). The fabricated silicon photonics wafer may be, for example, silicon photonics wafer 202 in FIG. 2. Then the assembler bonds the active silicon photonics layer of the fabricated silicon photonics wafer to a temporary glass handler wafer similar to process step 404 in FIG. 4 (step 804).

Afterward, the assembler removes the silicon substrate from the fabricated silicon photonics wafer exposing a backside surface of the standard thin buried oxide layer similar to process step 406 in FIG. 4 (step 806). Subsequently, the assembler adds a low-optical refractive index backing wafer to the exposed backside surface of the standard thin buried oxide layer of the fabricated silicon photonics wafer similar to process step 408 in FIG. 4 (step 808). The low-optical refractive index backing wafer may be, for example, a glass substrate backing wafer or a silicon substrate backing wafer. The silicon substrate backing wafer includes a thick oxide layer, which is attached to the exposed backside of the thin buried oxide layer of the silicon photonics wafer. Then the assembler detaches the active silicon photonics layer of the fabricated silicon photonics wafer from the temporary glass handler wafer similar to process step 410 in FIG. 4 (step 810). The process terminates thereafter.

Figure 9:
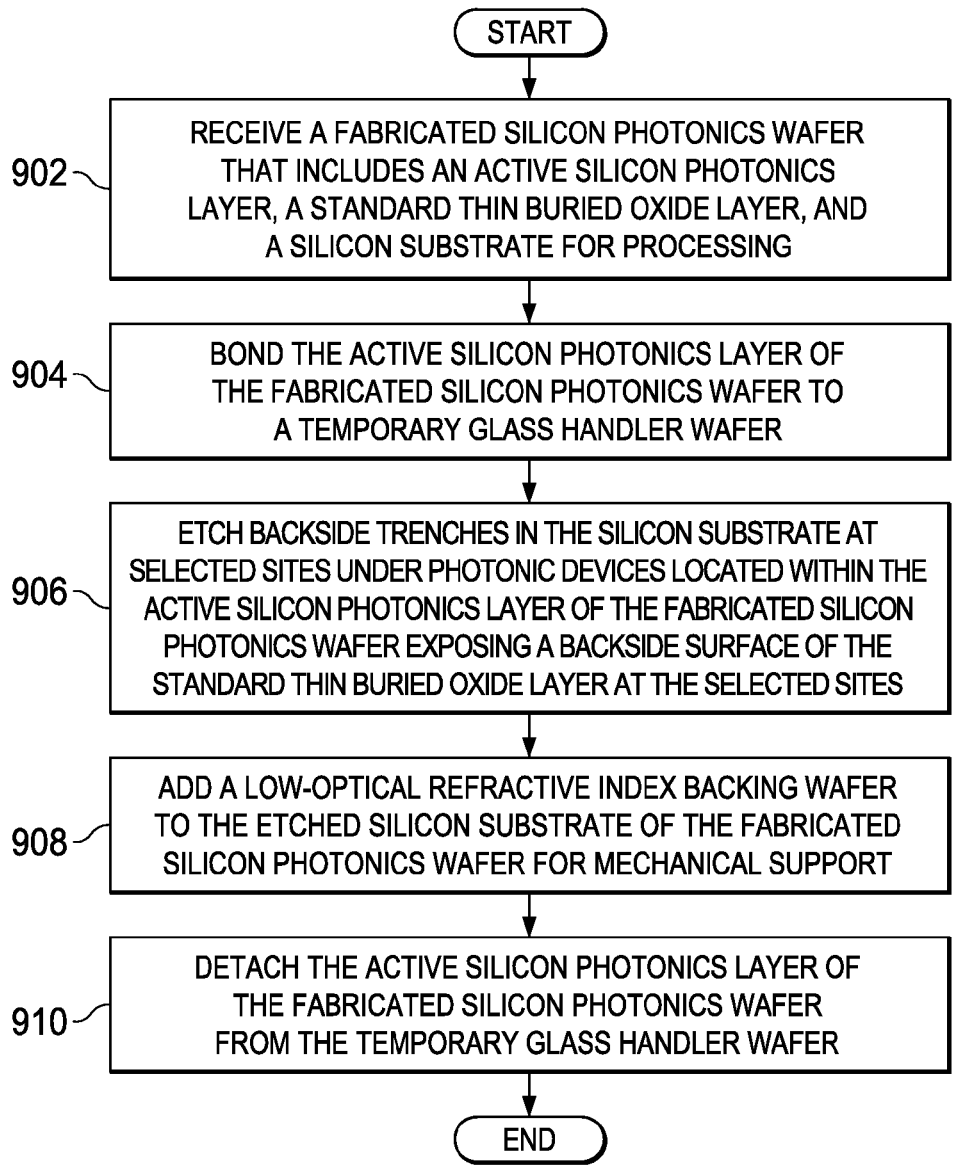
FIG. 9 is a flowchart illustrating yet another process for fabricating a silicon photonics wafer in accordance with an illustrative embodiment.

With reference now to FIG. 9, a flowchart illustrating yet another process for fabricating a silicon photonics wafer is shown in accordance with an illustrative embodiment. The process shown in FIG. 9 may be implemented in a fabrication process, such as fabrication process 500 in FIG. 5. In addition, a data processing system with a communicatively coupled assembler, such as data processing system 1000 in FIG. 10, may perform the process shown in FIG. 9.

The process begins when the assembler receives a fabricated silicon photonics wafer that includes an active silicon photonics layer, a standard thin buried oxide layer, and a silicon substrate for processing (step 902). The fabricated silicon photonics wafer may be, for example, silicon photonics wafer 202 in FIG. 2. Then the assembler bonds the active silicon photonics layer of the fabricated silicon photonics wafer to a temporary glass handler wafer similar to process step 504 in FIG. 5 (step 904).

After bonding the active silicon photonics layer of the fabricated silicon photonics wafer to a temporary glass handler wafer in step 904, the assembler etches backside trenches in the silicon substrate at selected sites under photonic devices located within the active silicon photonics layer of the fabricated silicon photonics wafer exposing a backside surface of the standard thin buried oxide layer at the selected sites similar to process step 506 in FIG. 5 (step 906). In addition, electrical devices may be located within the active silicon photonics layer of the fabricated silicon photonics wafer where the silicon substrate was not removed by etching step 906.

Then the assembler adds a low-optical refractive index backing wafer to the etched silicon substrate of the fabricated silicon photonics wafer for mechanical support similar to process step 508 in FIG. 5 (step 908). The low-optical refractive index backing wafer added to the etched silicon substrate of the fabricated silicon photonics wafer may be, for example, a glass substrate backing wafer or a silicon substrate backing wafer. Afterward, the assembler detaches the active silicon photonics layer of the fabricated silicon photonics wafer from the temporary glass handler wafer similar to process step 510 in FIG. 5 (step 910). The process terminates thereafter.

With reference now to FIG. 10, a diagram of a data processing system is depicted in accordance with an illustrative embodiment. Data processing system 1000 may be used to implement the processes shown in the flowcharts of FIGS. 7-9. In this illustrative example, data processing system 1000 includes communications framework 1002, which provides communications between processor unit 1004, memory 1006, persistent storage 1008, communications unit 1010, input/output (I/O) unit 1012, and display 1014. In addition, data processing system 1000 is communicatively coupled to assembler 1028 via communications framework 1002. In this example, communications framework 1002 may take the form of a bus system.

Processor unit 1004 serves to execute instructions for software that may be loaded into memory 1006. Processor unit 1004 may be a number of processors, a multi-processor core, or some other type of processor, depending on the particular implementation.

Memory 1006 and persistent storage 1008 are examples of storage devices 1016. A storage device is any piece of hardware that is capable of storing information, such as, for example, without limitation, data, program code in functional form, and/or other suitable information either on a temporary basis and/or a persistent basis. Storage devices 1016 may also be referred to as computer readable storage devices in these illustrative examples. Memory 1006 in these examples may be, for example, a random access memory or any other suitable volatile or non-volatile storage device. Persistent storage 1008 may take various forms, depending on the particular implementation.

For example, persistent storage 1008 may contain one or more components or devices. For example, persistent storage 1008 may be a hard drive, a flash memory, a rewritable optical disk, a rewritable magnetic tape, or some combination of the above. The media used by persistent storage 1008 also may be removable. For example, a removable hard drive may be used for persistent storage 1008.

Communications unit 1010, in these illustrative examples, provides for communications with other data processing systems or devices. In these illustrative examples, communications unit 1010 is a network interface card.

Input/output unit 1012 allows for input and output of data with other devices that may be connected to data processing system 1000. For example, input/output unit 1012 may provide a connection for user input through a keyboard, a mouse, and/or some other suitable input device. Further, input/output unit 1012 may send output to a printer. Display 1014 provides a mechanism to display information to a user. Data processing system 1000 uses assembler 1028 to fabricate, assemble, or process, for example, optical transceiver chips, such as silicon photonics chip 600 in FIG. 6.

Instructions for the operating system, applications, and/or programs may be located in storage devices 1016, which are in communication with processor unit 1004 through communications framework 1002. The processes of the different embodiments may be performed by processor unit 1004 using computer-implemented instructions, which may be located in a memory, such as memory 1006.

These instructions are referred to as program code, computer usable program code, or computer readable program code that may be read and executed by a processor in processor unit 1004. The program code in the different embodiments may be embodied on different physical or computer readable storage media, such as memory 1006 or persistent storage 1008.

Program code 1018 is located in a functional form on computer readable media 1020 that is selectively removable and may be loaded onto or transferred to data processing system 1000 for execution by processor unit 1004. Program code 1018 and computer readable media 1020 form computer program product 1022 in these illustrative examples. In one example, computer readable media 1020 may be computer readable storage media 1024 or computer readable signal media 1026. In these illustrative examples, computer readable storage media 1024 is a physical or tangible storage device used to store program code 1018 rather than a medium that propagates or transmits program code 1018.

Alternatively, program code 1018 may be transferred to data processing system 1000 using computer readable signal media 1026. Computer readable signal media 1026 may be, for example, a propagated data signal containing program code 1018. For example, computer readable signal media 1026 may be an electromagnetic signal, an optical signal, and/or any other suitable type of signal. These signals may be transmitted over communications links, such as wireless communications links, optical fiber cable, coaxial cable, a wire, and/or any other suitable type of communications link.

The different components illustrated for data processing system 1000 are not meant to provide architectural limitations to the manner in which different embodiments may be implemented. The different advantageous embodiments may be implemented in a data processing system including components in addition to and/or in place of those illustrated for data processing system 1000. Other components shown in FIG. 10 can be varied from the illustrative examples shown. The different embodiments may be implemented using any hardware device or system capable of running program code 1018.

Thus, illustrative embodiments provide a method and apparatus for processing a silicon photonics wafer. The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiment. The terminology used herein was chosen to best explain the principles of the embodiment, the practical application or technical improvement over technologies found in the marketplace, or to enable others of ordinary skill in the art to understand the embodiments disclosed here.

The flowcharts and block diagrams in the Figures illustrate the architecture, functionality, and operation of possible implementations of methods according to various embodiments of the present invention. In this regard, each block in the flowcharts or block diagrams may represent a module, segment, or portion of code which comprises one or more executable instructions for implementing the specified logical function(s). It also should be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustrations, and combinations of blocks in the block diagrams and/or flowchart illustrations, can be implemented by special purpose hardware-based systems that perform the specified functions or acts, or combinations of special purpose hardware and computer instructions.

The circuit as described above is part of the design for an integrated circuit chip. The chip design is created in a graphical computer programming language and stored in a computer readable storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the computer readable storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The description of the present invention has been presented for purposes of illustration and description and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method for processing a silicon photonics wafer, the method comprising:
   receiving the silicon photonics wafer that includes an active silicon photonics layer, a thin buried oxide layer, and a silicon substrate for processing, wherein the thin buried oxide layer is located between the active silicon photonics layer and the silicon substrate;
   receiving an electrical complementary metal-oxide-semiconductor wafer that includes an active electrical layer;
   flip chip bonding the active silicon photonics layer of the silicon photonics wafer to the active electrical layer of the electrical complementary metal-oxide-semiconductor wafer; and
   removing the silicon substrate from the silicon photonics wafer exposing a backside surface of the thin buried oxide layer.

2. The method of claim 1 further comprising:
   adding a low-optical refractive index backing wafer to the exposed backside surface of the thin buried oxide layer of the silicon photonics wafer.

3. The method of claim 2, wherein the low-optical refractive index backing wafer added to the exposed backside surface of the thin buried oxide layer of the silicon photonics wafer is a glass substrate wafer.

4. The method of claim 2, wherein the low-optical refractive index backing wafer added to the exposed backside surface of the thin buried oxide layer of the silicon photonics wafer is a silicon substrate wafer.

5. The method of claim 4, wherein the silicon substrate wafer added to the exposed backside surface of the thin buried oxide layer of the silicon photonics wafer includes a thick oxide layer, wherein the thick oxide layer is attached to the thin buried oxide layer of the silicon photonics wafer.

6. The method of claim 5, wherein the thick oxide layer included on the silicon substrate wafer is greater than or equal to a one micrometer thickness.

7. The method of claim 1, wherein the thin buried oxide layer is less than or equal to a 500 nanometer thickness.

8. A method for processing a silicon photonics wafer, the method comprising:
   receiving the silicon photonics wafer that includes an active silicon photonics layer, a thin buried oxide layer, and a silicon substrate for processing, wherein the thin buried oxide layer is located between the active silicon photonics layer and the silicon substrate;
   bonding the active silicon photonics layer of the silicon photonics wafer to a temporary glass handler wafer;
   removing the silicon substrate from the silicon photonics wafer exposing a backside surface of the thin buried oxide layer;
   adding a low-optical refractive index backing wafer to the exposed backside of the thin buried oxide layer of the silicon photonics wafer; and
   detaching the active silicon photonics layer of the silicon photonics wafer from the temporary glass handler wafer after the low-optical refractive index backing wafer is added to the exposed backside of the thin buried oxide layer.

9. The method of claim 8, wherein the low-optical refractive index backing wafer added to the exposed backside surface of the thin buried oxide layer of the silicon photonics wafer is a glass substrate wafer.

10. The method of claim 8, wherein the low-optical refractive index backing wafer added to the exposed backside surface of the thin buried oxide layer of the silicon photonics wafer is a silicon substrate wafer.

11. The method of claim 10, wherein the silicon substrate wafer added to the exposed backside surface of the thin buried oxide layer of the silicon photonics wafer includes a thick oxide layer, wherein the thick oxide layer is attached to the thin buried oxide layer of the silicon photonics wafer.

12. The method of claim 11, wherein the thick oxide layer included on the silicon substrate wafer is greater than or equal to a one micrometer thickness.

13. The method of claim 8, wherein the thin buried oxide layer is less than or equal to a 500 nanometer thickness.

14. A method for processing a silicon photonics wafer, the method comprising:
   receiving the silicon photonics wafer that includes an active silicon photonics layer, a thin buried oxide layer, and a silicon substrate for processing, wherein the thin buried oxide layer is located between the active silicon photonics layer and the silicon substrate;
   bonding the active silicon photonics layer of the silicon photonics wafer to a temporary glass handler wafer;
   etching backside trenches in the silicon substrate at selected sites under photonic devices located within the active silicon photonics layer of the silicon photonics wafer exposing a backside surface of the thin buried oxide layer at the selected sites;
   adding a low-optical refractive index backing wafer to the etched silicon substrate of the silicon photonics wafer; and
   detaching the active silicon photonics layer of the silicon photonics wafer from the temporary glass handler wafer after the low-optical refractive index backing wafer is added to the etched silicon substrate.

15. The method of claim 14, wherein electrical devices are located within the active silicon photonics layer of the silicon photonics wafer located where the silicon substrate was not removed by the etching step.

16. The method of claim 14, wherein the low-optical refractive index backing wafer added to the etched silicon substrate of the silicon photonics wafer is a glass substrate wafer.

17. The method of claim 14, wherein the low-optical refractive index backing wafer added to the etched silicon substrate of the silicon photonics wafer is a silicon substrate wafer.

18. The method of claim 14, wherein the thin buried oxide layer is less than or equal to a 500 nanometer thickness.

19. A silicon photonics wafer, the silicon photonics wafer comprising:
   an active silicon photonics layer that includes a plurality of photonic devices and a plurality of electrical devices;
   a silicon substrate with backside trenches located at selected sites under every photonic device in the plurality of photonic devices in the active silicon photonics layer and silicon substrate columns where the silicon substrate was not removed by the backside trenches located under every electrical device in the plurality of electrical devices in the active silicon photonics layer;
   a thin buried oxide layer located between the active silicon photonics layer and the silicon substrate; and
   a low-optical refractive index backing wafer bonded to a backside of the silicon substrate that covers the backside trenches.

20. The silicon photonics wafer of claim 19, wherein the low-optical refractive index backing wafer is a glass substrate wafer.

21. The silicon photonics wafer of claim 19, wherein the low-optical refractive index backing wafer is a silicon substrate wafer.

22. The silicon photonics wafer of claim 19, wherein the thin buried oxide layer is less than or equal to a 500 nanometer thickness.

23. The silicon photonics wafer of claim 19, wherein the backside trenches expose a backside surface of the thin buried oxide layer at the selected sites.

* * * * *